United States Patent
Bogner et al.

(10) Patent No.: US 8,071,990 B2
(45) Date of Patent: Dec. 6, 2011

(54) OPTOELECTRONIC COMPONENT THAT EMITS ELECTROMAGNETIC RADIATION AND ILLUMINATION MODULE

(75) Inventors: Georg Bogner, Lappersdorf (DE); Moritz Engl, Regensburg (DE); Stefan Grötsch, Lengfeld/Bad Abbach (DE); Patrick Joseph Kromotis, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 791 days.

(21) Appl. No.: 11/658,822

(22) PCT Filed: Jul. 21, 2005

(86) PCT No.: PCT/DE2005/001283
§ 371 (c)(1),
(2), (4) Date: May 12, 2008

(87) PCT Pub. No.: WO2006/012842
PCT Pub. Date: Feb. 9, 2006

(65) Prior Publication Data
US 2009/0001490 A1    Jan. 1, 2009

(30) Foreign Application Priority Data
Jul. 26, 2004  (DE) .................. 10 2004 036 157

(51) Int. Cl.
*H01L 33/00* (2010.01)

(52) U.S. Cl. ..... 257/98; 257/99; 257/100; 257/E31.127; 257/E31.106; 438/22; 362/249.02

(58) Field of Classification Search ............. 257/98, 257/99, 100, 432, 435, E31.127, E31.106, 257/79, 88, 96, 97, 101, 102, 103; 362/244, 362/309, 332, 347, 509, 544, 545, 185, 249.02, 362/235, 236, 800, 249.06, 539, 543, 555, 362/84, 558, 230, 231, 249.01; 438/128, 438/22–29, 46, 47, 129
See application file for complete search history.

(56) References Cited

U.S. PATENT DOCUMENTS
5,727,108 A     3/1998  Hed
6,057,650 A *  5/2000  Betz et al. ............. 315/289
(Continued)

FOREIGN PATENT DOCUMENTS
DE        199 24 316  A1     11/2000
(Continued)

OTHER PUBLICATIONS

Schnitzer, et al., "30% external quantum efficiency from surface textured, thin-film light-emitting diodes", Appl. Phys. Letters, vol. 63, No. 16, pp. 2174-2176, Oct. 18, 1993.

*Primary Examiner* — Cuong Q Nguyen
*Assistant Examiner* — Yosef Gebreyesus
(74) *Attorney, Agent, or Firm* — Cozen O'Connor

(57) ABSTRACT

An optoelectronic component emitting electromagnetic radiation, comprising a housing body which has a cavity, the cavity being fashioned trenchlike and in the cavity a plurality of semiconductor chips being arranged in a linear arrangement. Two neighboring semiconductor chips have a distance from one another which is less than or equal to one-and-a-half lateral edge lengths of the semiconductor chips and greater than or equal to 0 μm. In addition, an illumination module comprising such a component is disclosed.

28 Claims, 13 Drawing Sheets

U.S. PATENT DOCUMENTS

Figure 4:
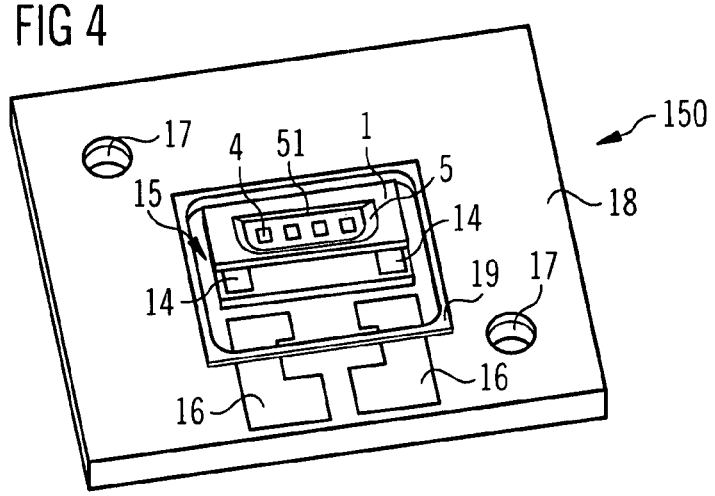

| | | | |
|---|---|---|---|
| 6,066,861 A * | 5/2000 | Hohn et al. ............... 257/99 |
| 6,540,377 B1 | 4/2003 | Ota et al. |
| 6,560,038 B1 * | 5/2003 | Parkyn et al. ............. 359/726 |
| 6,585,395 B2 * | 7/2003 | Luk ........................ 362/249.02 |
| 2001/0019486 A1 * | 9/2001 | Thominet ................. 362/543 |
| 2001/0045573 A1 | 11/2001 | Waitl et al. |
| 2002/0017844 A1 * | 2/2002 | Parkyn et al. ............. 313/113 |
| 2002/0181899 A1 * | 12/2002 | Tartaglia et al. ........... 385/89 |
| 2002/0196639 A1 * | 12/2002 | Weidel ..................... 362/521 |
| 2003/0042844 A1 | 3/2003 | Matsumura et al. |
| 2003/0156425 A1 * | 8/2003 | Turnbull et al. ........... 362/545 |
| 2003/0234431 A1 | 12/2003 | Huang et al. |
| 2004/0100192 A1 * | 5/2004 | Yano et al. ................ 313/512 |
| 2004/0208018 A1 * | 10/2004 | Sayers et al. ............. 362/544 |
| 2005/0041434 A1 * | 2/2005 | Yatsuda et al. ............ 362/459 |
| 2006/0193145 A1 | 8/2006 | Eichhorn et al. |

FOREIGN PATENT DOCUMENTS

| | | |
|---|---|---|
| DE | 196 38 667 C2 | 5/2001 |
| DE | 103 15 131 A1 | 10/2004 |
| EP | 0 933 823 A2 | 1/1999 |
| EP | 1 103 759 A | 5/2001 |
| EP | 1 388 707 A2 | 7/2003 |
| EP | 1 447 617 A | 8/2004 |
| EP | 1 502 752 A | 2/2005 |
| EP | 1 526 581 A | 4/2005 |
| JP | 01187778 | 7/1989 |
| JP | 09-321341 A | 12/1997 |
| JP | 2000208822 | 7/2000 |
| JP | 2000312033 | 11/2000 |
| JP | 2001326389 | 11/2001 |
| JP | 2001-345485 | 12/2001 |
| JP | 200253516 | 6/2002 |
| JP | 2002-314146 A | 10/2002 |
| JP | 2002334607 | 11/2002 |
| JP | 2003-031011 A | 1/2003 |
| JP | 2003-526121 | 9/2003 |
| JP | 2003347601 | 12/2003 |
| JP | 2004071409 | 3/2004 |
| JP | 2004177482 | 6/2004 |
| KR | 10 2001-00515 | 6/2001 |
| WO | WO 98/12757 | 3/1998 |
| WO | WO 2004/088201 A | 10/2004 |

\* cited by examiner

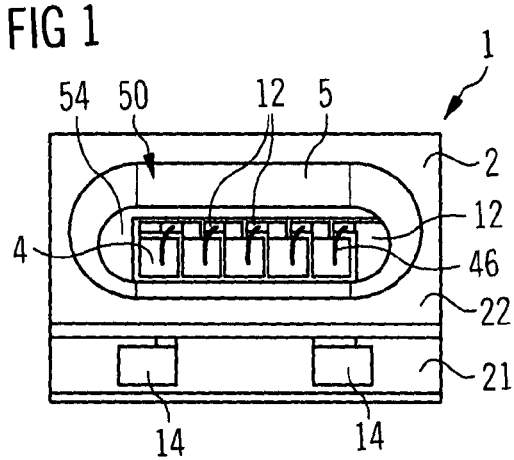
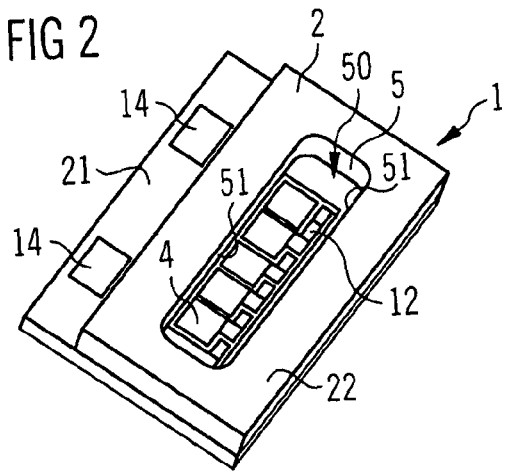
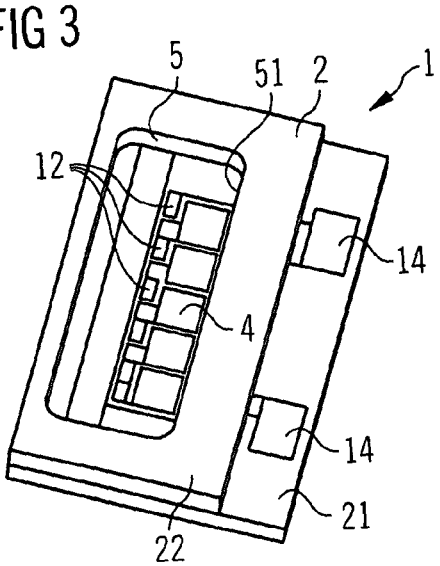

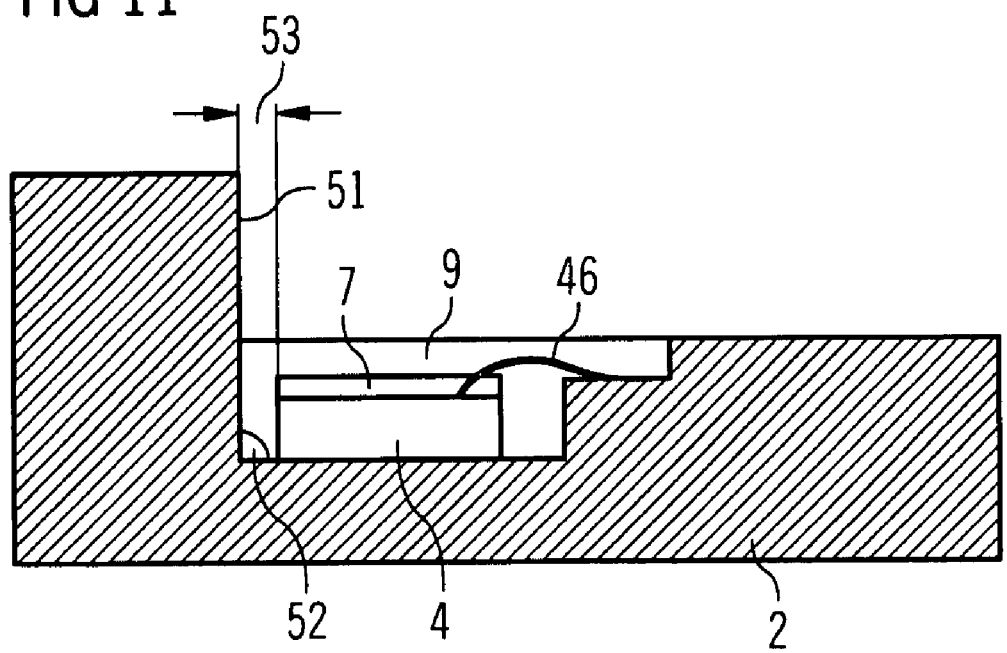
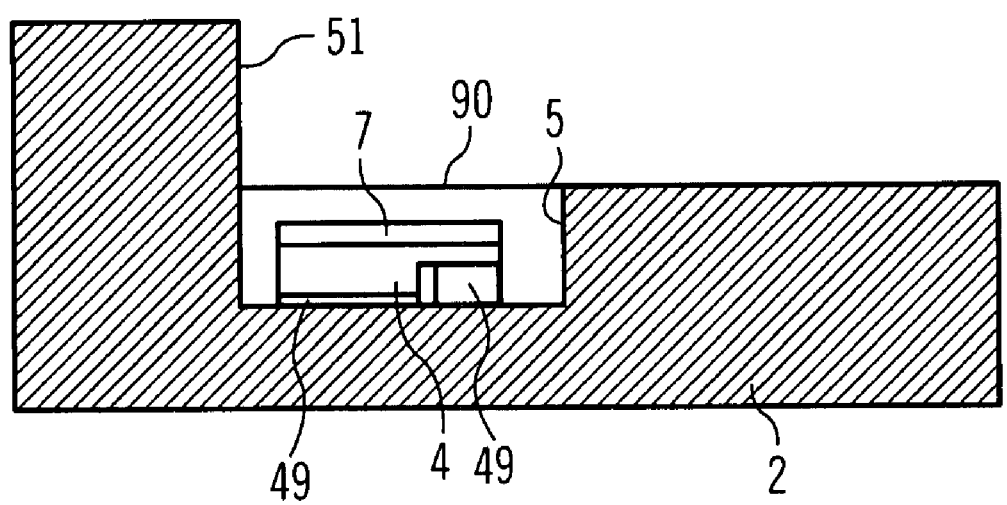

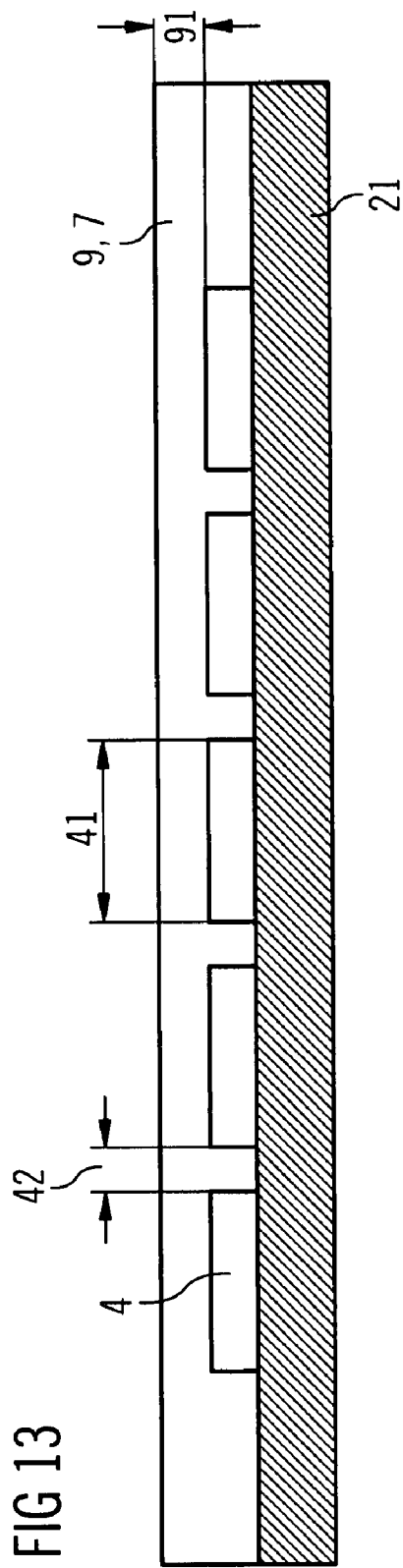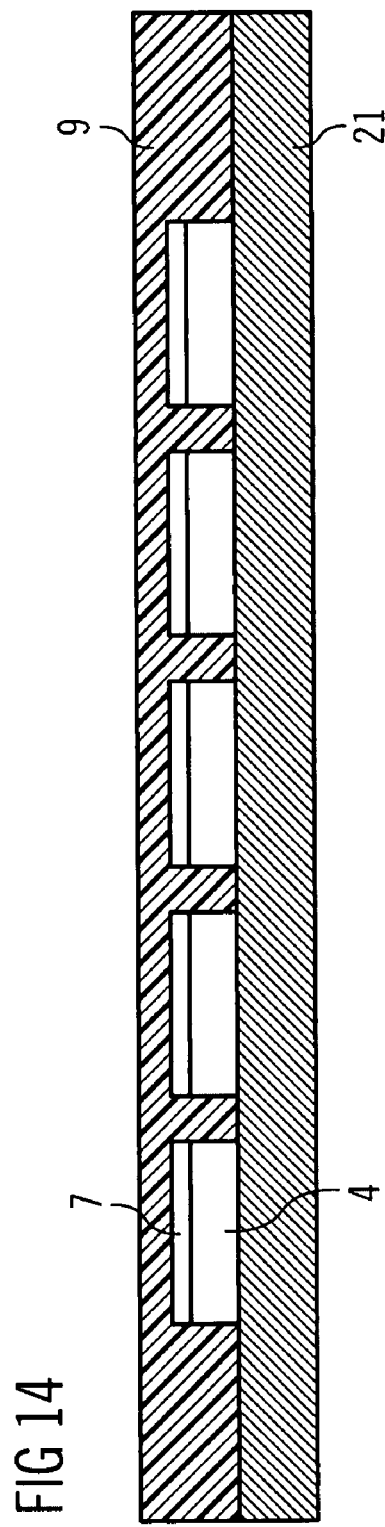

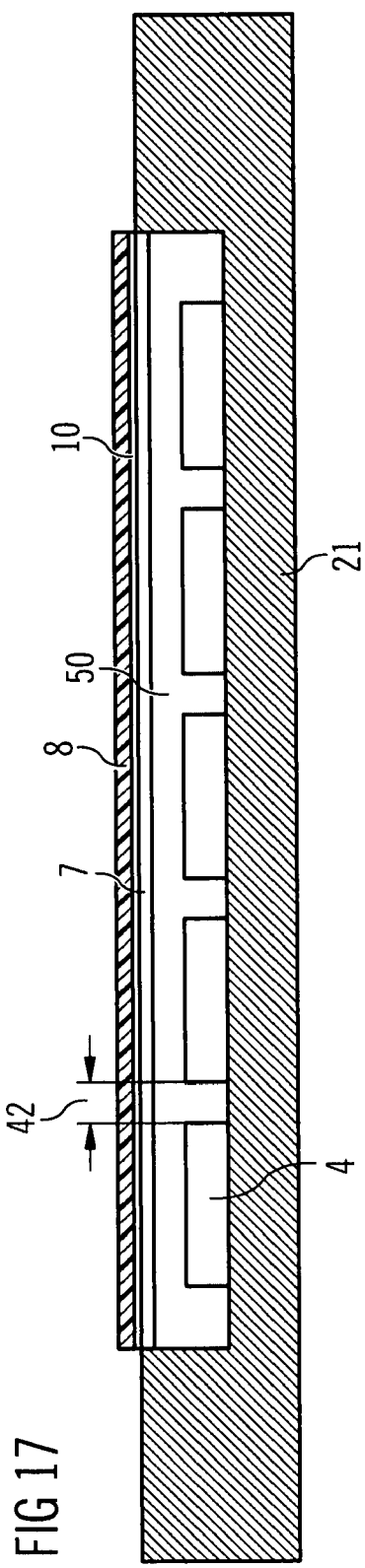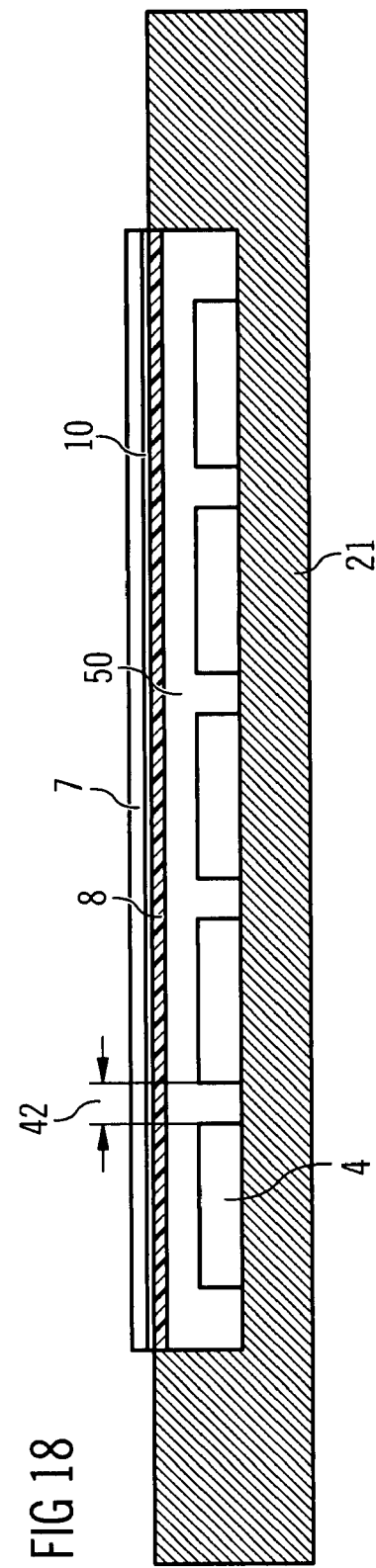

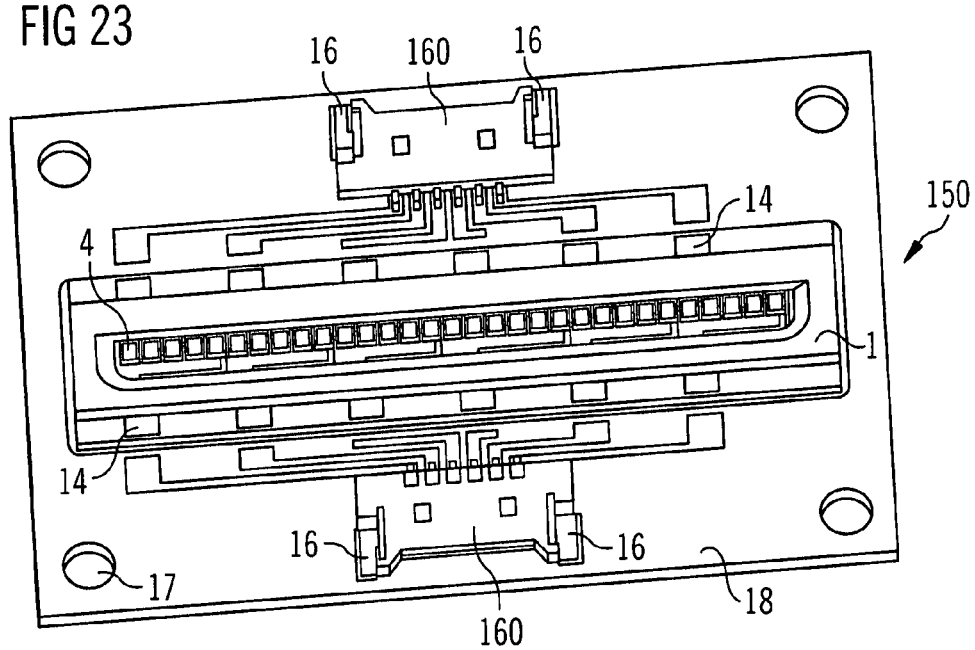
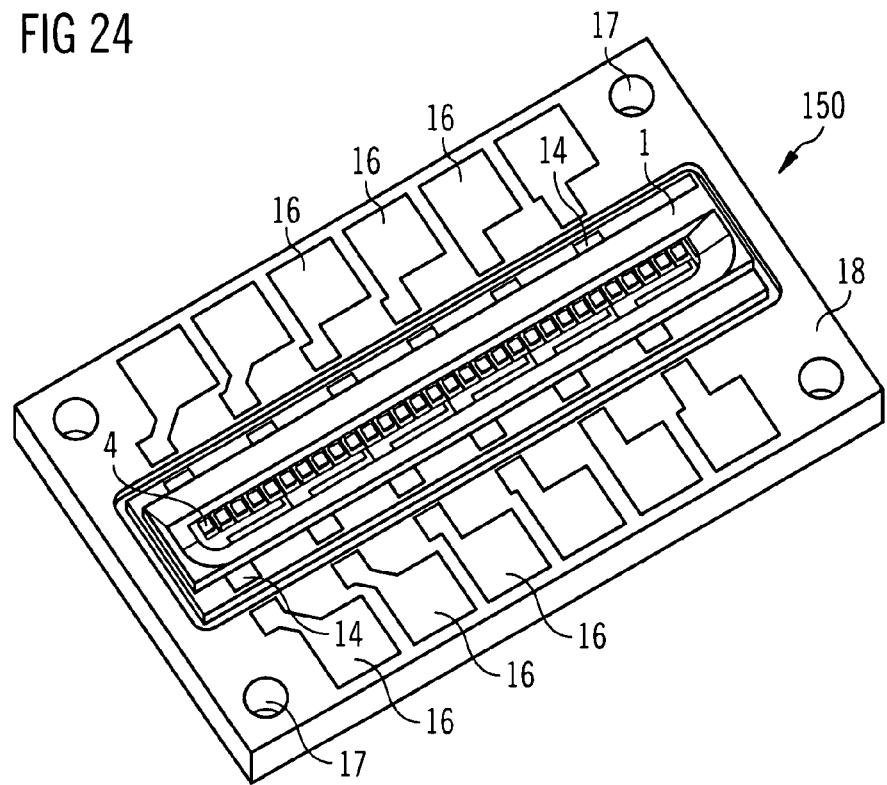

OPTOELECTRONIC COMPONENT THAT EMITS ELECTROMAGNETIC RADIATION AND ILLUMINATION MODULE

RELATED APPLICATIONS

This is a U.S. national stage of application No. PCT/DE2005/001283, filed on Jul. 21, 2005.

The present application claims the priority of German patent application 10 2004 036 157.6 filed Jul. 26, 2004, the content of the disclosure of which is herewith incorporated by reference.

FIELD OF THE INVENTION

The invention relates to an optoelectronic component emitting electromagnetic radiation, comprising a housing body which has a cavity, and to an illumination module comprising such a component.

BACKGROUND OF THE INVENTION

In published US patent application no. 2001/0045573, a surface-mounted optoelectronic component is disclosed. It has a lead frame of two metallic strips and a light-emitting diode chip which is mounted on one of the metallic strips and is electrically conductively connected to the other one of the metallic strips by means of a contact wire. The component also has a housing with a cuboid bottom part which is bonded to the lead frame from below, and a rectangular frame part which is attached to the lead frame from above. The frame part defines a housing cavity which is covered with a cover transparent to radiation.

The intensity of radiation of a single radiation-emitting semiconductor chip is not sufficient for many applications such as, for example, illuminators or lamps but a plurality of semiconductor chips is needed. In such cases, a plurality of components having in each case one semiconductor chip is frequently used. This is described in EP 0 933 823 A2. In this arrangement, the individual components serve as single pixels which are arranged, for example, in the manner of a matrix for an array illuminator or by means of which a spherical lamp is formed in which a number of single pixels or components are grouped around a feed rod.

Although such lamps can be quite suitable for general illumination purposes, their suitability for applications in which the highest possible luminance and the smallest possible radiation angle is required is limited. For example, when individual components are used, limits are set to the densest and most compact possible arrangement of a number of semiconductor chips which in itself is due to the size of the component housing. In addition, it is required to connect each individual component electrically which also costs space and can be relatively expensive and as a result of which space requirement and manufacturing expenditure are increased further.

SUMMARY OF THE INVENTION

It is one object of the present invention to provide a component which enables a compact arrangement of semiconductor chips and which, in particular, has a radiation characteristic which is suitable for headlamp applications such as, for example, car headlamps in which a high luminance, a narrow radiation angle and a well-defined special shape of the radiation cone are required.

This and other objects are attained in accordance with one aspect of the invention directed to an optoelectronic component emitting electromagnetic radiation, comprising a housing body which has a trenchlike cavity therein, a plurality of semiconductor chips arranged linearly within said cavity, and wherein two neighboring semiconductor chips have a distance from one another which is less than or equal to 1.5-times the lateral edge length of the semiconductor chips and greater than or equal to 0 μm.

A trenchlike cavity can be formed in a component of the type mentioned above, wherein in the cavity, a plurality of semiconductor chips are arranged in a linear arrangement.

Due to the linear arrangement of the semiconductor chips, a shape of a radiation cone emitted by the component can be achieved which is advantageous for many applications. It is thus possible that a cross section of the radiation cone has a relatively great length and a comparatively small width which is advantageous, e.g. for application in car headlamps in which a relatively small solid angle is to be irradiated vertically but the roadway is to be irradiated in its full width, i.e. a relatively large solid angle horizontally.

In the component, two neighboring semiconductor chips advantageously have a distance from one another which is less than or equal to 1.5-times the lateral edge length of the semiconductor chips and greater than or equal to 0 μm. Due to the narrow arrangement of the semiconductor chips, the component is suitable for generating a radiation cone which is as homogeneous as possible and which is emitted into the narrowest possible solid angle so that the highest possible radiation intensity can be projected onto the smallest possible area. A lateral edge length is understood to be a distance of chip edges of the semiconductor chip which are opposite one another, measured in the direction of the arrangement of the semiconductor chips.

The neighboring semiconductor chips advantageously have a distance from one another of less than or equal to 300 μm, particularly preferably of less than or equal to 100 μm and greater than or equal to 0 μm.

The semiconductor chips are suitably arranged on a printed circuit board (PCB) or on a lead frame.

The housing body particularly advantageously has on one side along the arrangement of the semiconductor chips an inner wall delimiting the cavity, at least a section of the inner wall being constructed as a screening wall which is reflective for at least one spectral band of the electromagnetic radiation. By means of such a screening wall, the emission of the irradiation into an unwanted spatial area can be suppressed. For this purpose, the screening wall suitably extends essentially at an angle of greater than or equal to 80° and less than or equal to 110° with respect to a mounting plane of the semiconductor chips. In particular, the screening wall extends essentially perpendicularly to the mounting plane.

The semiconductor chips are advantageously arranged at a distance of less than or equal to 1 mm, preferably of less than or equal to 500 μm, particularly preferably of less than or equal to 150 μm and greater than or equal to 0 mm from the screening wall. Due to a small distance of the semiconductor chips from the screening wall, a part of the radiation cone impinges on the screening wall with relatively high radiation density so that effective shielding can be achieved, with the simultaneous possibility of shaping the radiation to form a low-divergence radiation cone of high radiation density.

In a preferred embodiment of the component, the arrangement of semiconductor chips has a first and a second end, wherein at the first end, at least two semiconductor chips are arranged along a first straight line which is inclined with respect to a second straight line along which at least two semiconductor chips are arranged at the second end. The first straight line is particularly preferably inclined with respect to the second straight line by an angle of inclination of less than or equal to 20° and greater than or equal to 10°, particularly of about 15°. A component of such characteristics is again particularly suitable for application in a motor vehicle headlamp.

According to the German ECE standard, the headlamp cone of a car headlamp must have, on the one hand, on the left-hand side in the direction of radiation of the headlamp a horizontally extending upper limit, in such a manner that drivers of approaching vehicles are not blinded. The right-hand side of the headlamp cone, in contrast, has an upper limit which is located in a plane tilted by 15° compared with the horizontal, in such a manner that the part of the road or the edge of the road located on the right in the direction of driving is illuminated better or farther in the direction of driving by the headlamp than the left-hand part. A headlamp having such characteristics can be implemented in a simple manner by means of the component.

In the component, at least one optical element is preferably provided which reduces a divergence of the electromagnetic radiation and which is jointly allocated to the semiconductor chips.

The optical element is particularly preferably a non-imaging optical concentrator, wherein a radiation entry of the optical element is the actual concentrator exit so that the radiation, compared with the usual application of a concentrator for focusing, passes through it in the reverse direction and is thus not concentrated but leaves the concentrator with reduced divergence through a radiation exit of the optical element.

The radiation entry preferably has a radiation entry area or a radiation entry opening which has a width of less than or equal to 1.5-times a lateral edge length of the semiconductor chips, preferably of less than or equal to 1.25-times the edge length. A lateral edge length is understood to be an extent of the semi-conductor chip perpendicular to its main direction of radiation.

Such a small radiation entry is advantageous for reducing the solid angle into which the electromagnetic radiation is emitted with the optical element as close as possible to the semiconductor chip where a cross-sectional area of the light cone is small. This is required, in particular, if the component is to be suitable to project the highest possible radiation intensity onto the smallest possible area. An important conserved quantity in geometric optics is the etendue, i.e. the radiation intensity. It is the product of the area of a light source and the solid angle into which it radiates. The conservation of the etendue has the consequence, among other things, that the light of a diffuse radiation source, for example of a semiconductor light-emitting diode can no longer be concentrated, i.e. no longer be deflected to an area having a smaller extent which is why it is advantageous if the beam enters the optical element with the smallest possible cross section.

So that, with a small radiation entry, the entire radiation emitted by a semiconductor chip can enter the optical element, it is correspondingly required to bring the radiation entry as close as possible to the semiconductor chip.

The optical element reduces the divergence of the light cone in a plane perpendicular to a line along which the semiconductor chips are arranged, in such a manner that the light cone has an aperture angle between 0 and 30°, preferably between 0 and 20°, particularly preferably between 0 and 10°, including the limits in each case.

For this purpose, the concentrator is preferably a CPC-, CEC- or CHC-type optical concentrator which, in the text which follows, means a concentrator, the reflective side walls of which at least partially and/or at least largely have the shape of a compound parabolic concentrator (CPC), of a compound elliptic concentrator (CEC) and/or of a compound hyperbolic concentrator (CHC).

As an alternative, the concentrator advantageously has side walls which connect the radiation entry to the radiation exit and which are constructed in such a manner that direct connecting lines between the radiation entry and the radiation exit, extending on the side walls, are essentially straight.

In this arrangement, the concentrator suitably has a basic body which defines a cavity and the inner wall of which is reflective at least for a spectral part-band of the electromagnetic radiation.

In an advantageous alternative, the concentrator is a dielectric concentrator, the basic body of which is a solid body consisting of a dielectric material having a suitable index of refraction so that radiation coupled in via the radiation entry is reflected by total reflection on the lateral boundary faces of the solid body to the surrounding medium which connect the radiation entry to the radiation exit.

The radiation exit of the dielectric concentrator is preferably a boundary face of the solid body domed in the manner of a lens, by means of which a further reduction in the divergence can be achieved.

In an advantageous embodiment, a gap which is preferably largely free of solid or liquid material exists between the semiconductor chips and the radiation entry of the concentrator. This makes it possible for a highly divergent proportion of the electromagnetic radiation not to enter the optical element as a result of which the divergence of the light cone emitted by the component can be further reduced, even if at the cost of the emitted radiation intensity.

The component preferably has a luminescence conversion element by means of which, in particular, white light can be generated.

In an embodiment of the invention, the luminescence conversion element is advantageously intermixed in a casting compound transparent to radiation, by means of which the semiconductor chips are at least partially encapsulated. The casting compound preferably has a thickness of less than or equal to 200 μm and greater than or equal to 5 μm over the semiconductor chips so that the conversion of the radiation emitted by the semiconductor chips takes place as close as possible to the semiconductor chips. This makes it possible for the electromagnetic radiation, if possible to be converted to the same degree, i.e. in as equal a proportion as possible, for all radiation angles.

As an alternative, the luminescence conversion element is advantageously applied in a thin layer directly to the semiconductor chips.

In a further advantageous alternative embodiment of the component, a carrier body transparent to radiation, on which the luminescence conversion element is applied is arranged on the semiconductor chips. In this arrangement, the luminescence conversion element is preferably arranged on a side of the carrier body facing away from the semiconductor chips.

The component preferably has a diffuser material by means of which a light cone can be achieved which is as homogeneous as possible with regard to color impression and radiation intensity.

The illumination module has an optoelectronic component according to one of the embodiments described above. It is preferably a headlamp module, particularly for a motor vehicle.

The illumination module preferably has an overvoltage protection for the component which, particularly preferably comprises at least one varistor.

Figure 5:
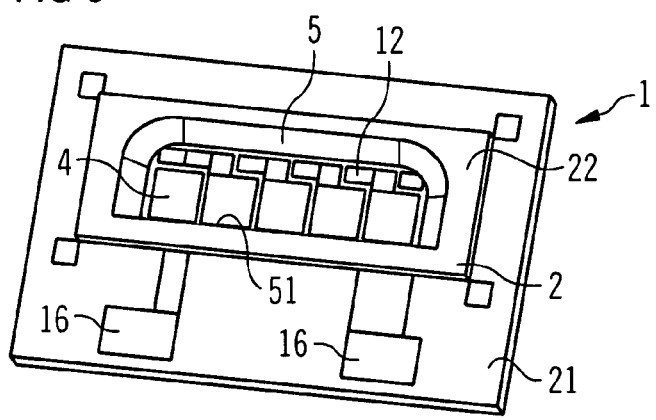
Figure 6:
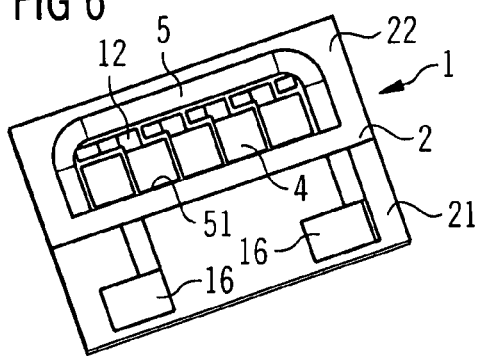
Figure 7:
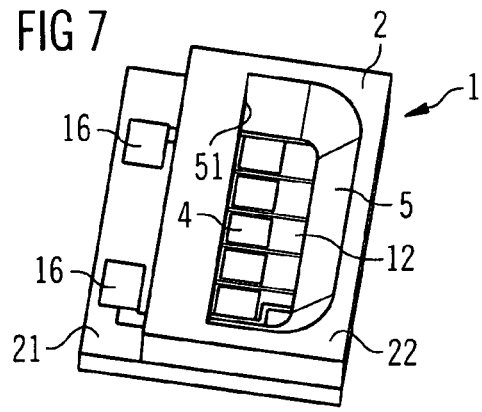
Figure 8:
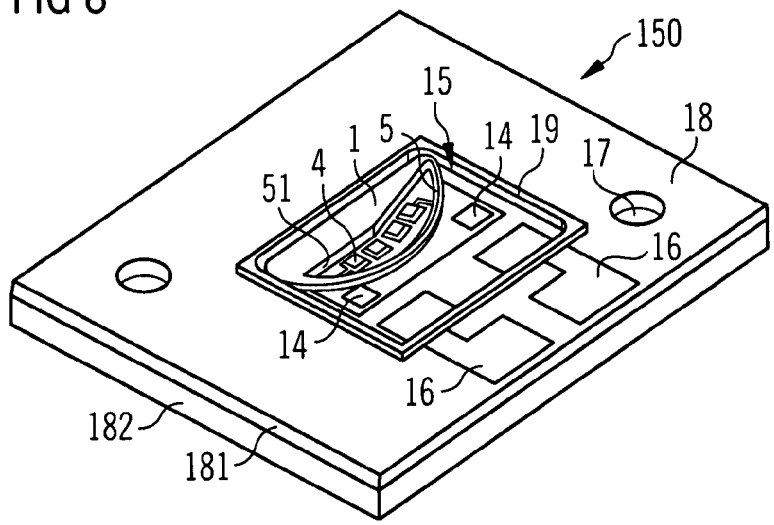
Figure 9:
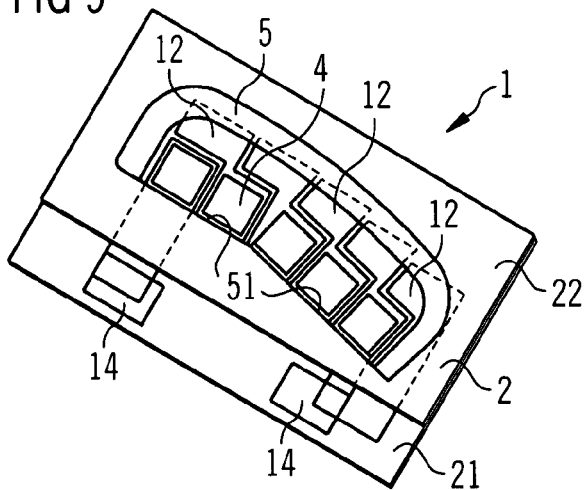
Figure 10:
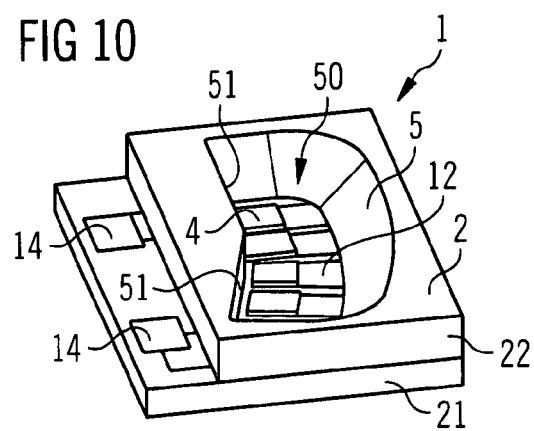
Figure 19:
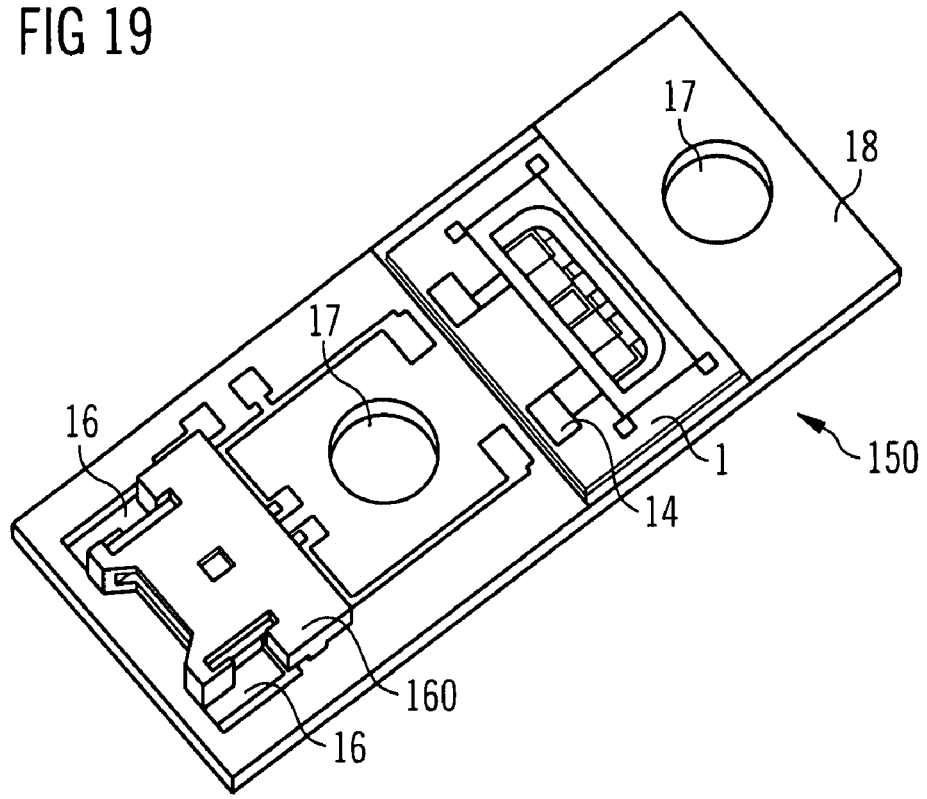
Figure 20:
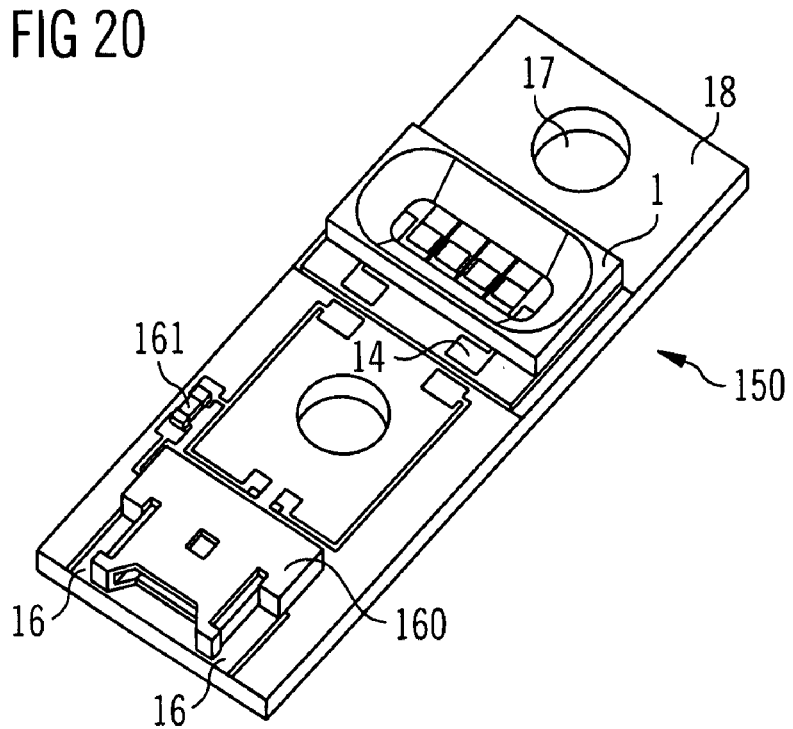
Figure 21:
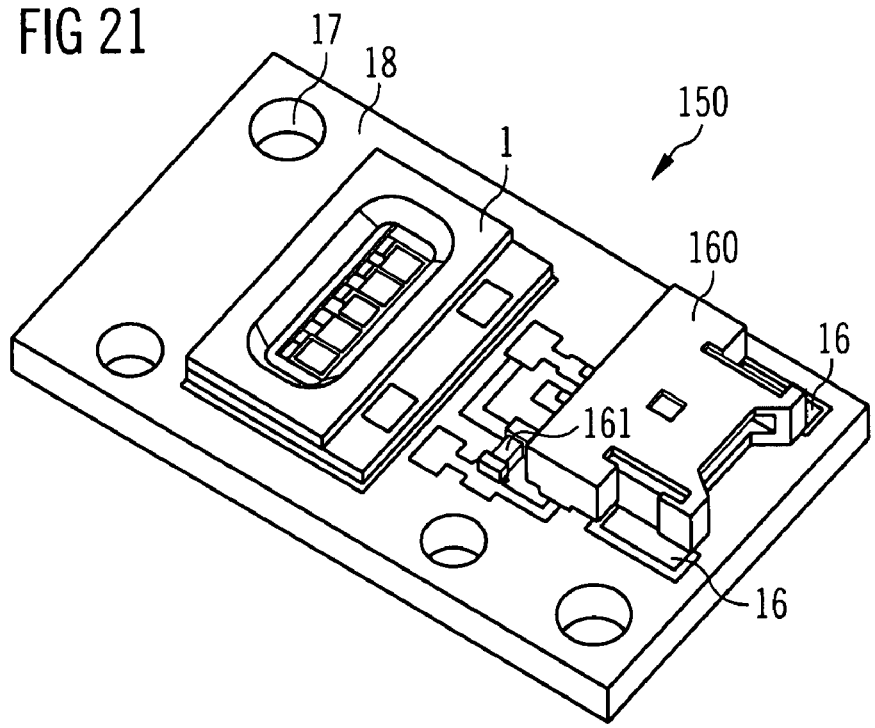
Figure 22:
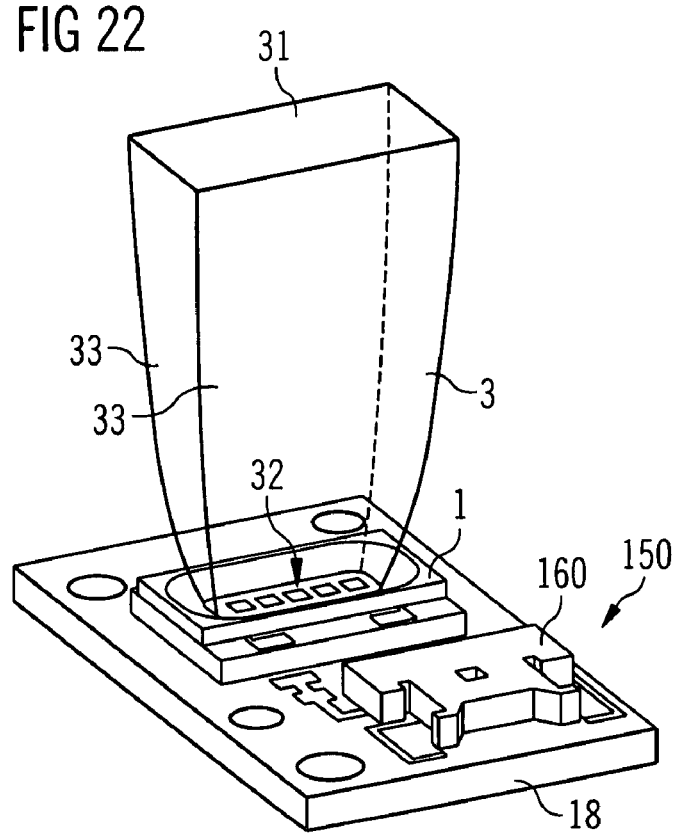
Figure 25:
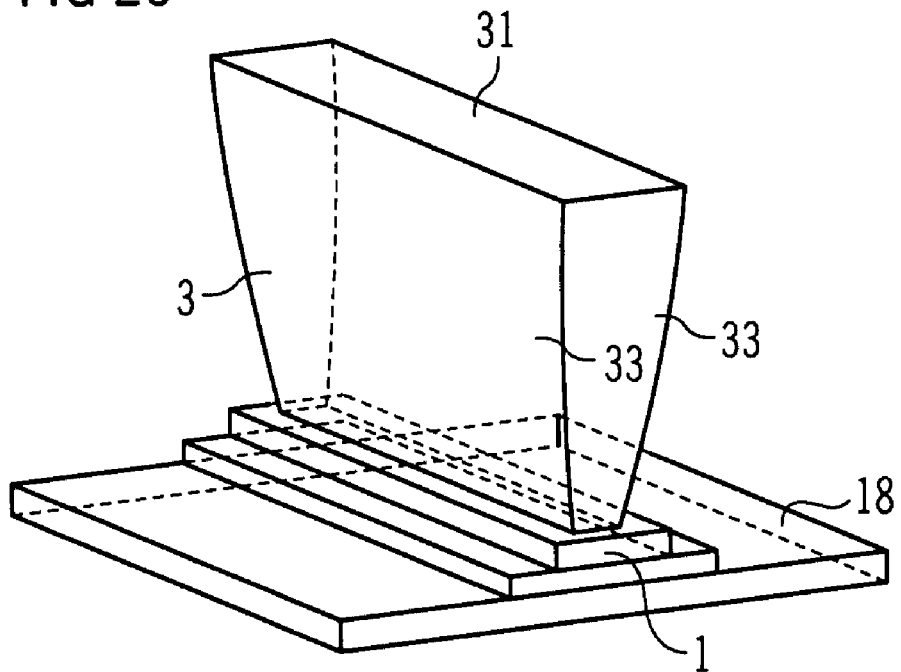
Figure 26:
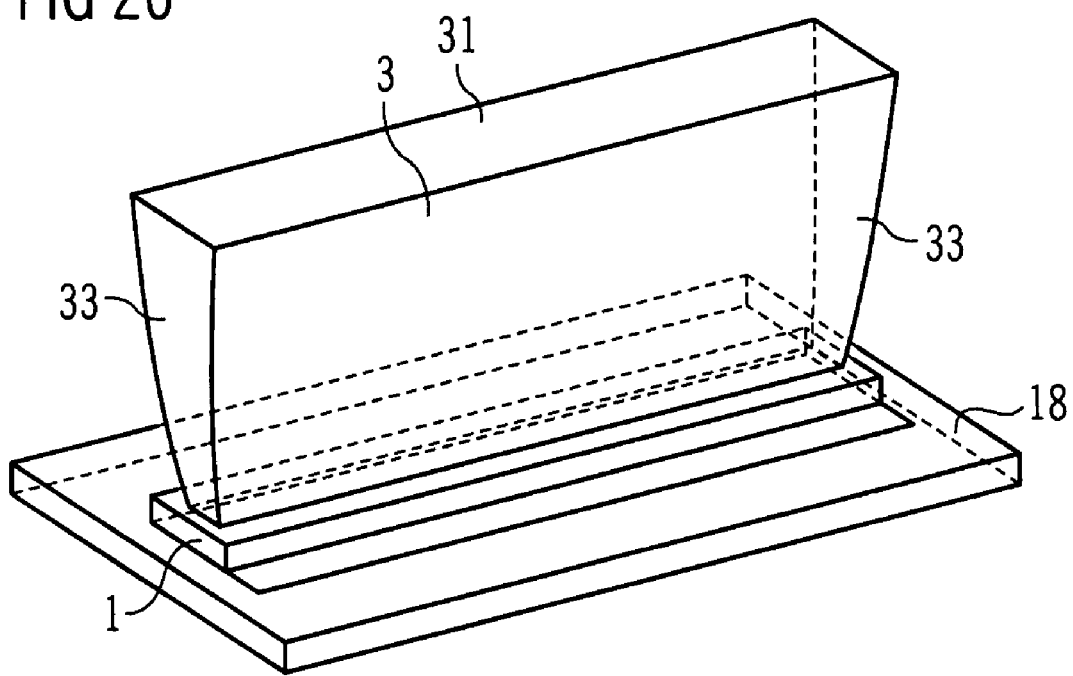
Figure 27:
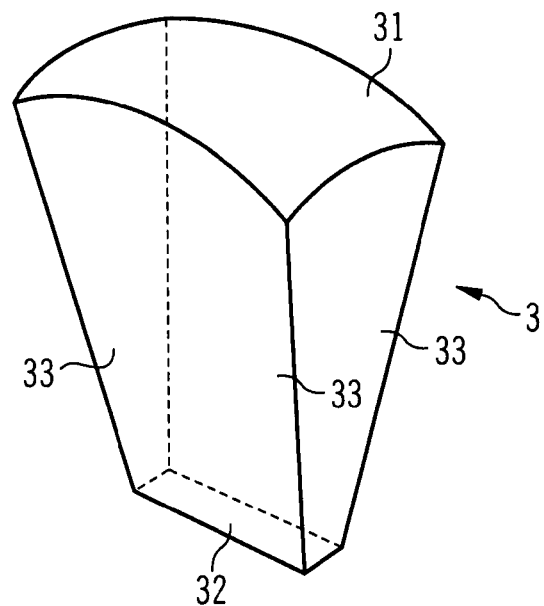
Figure 28:
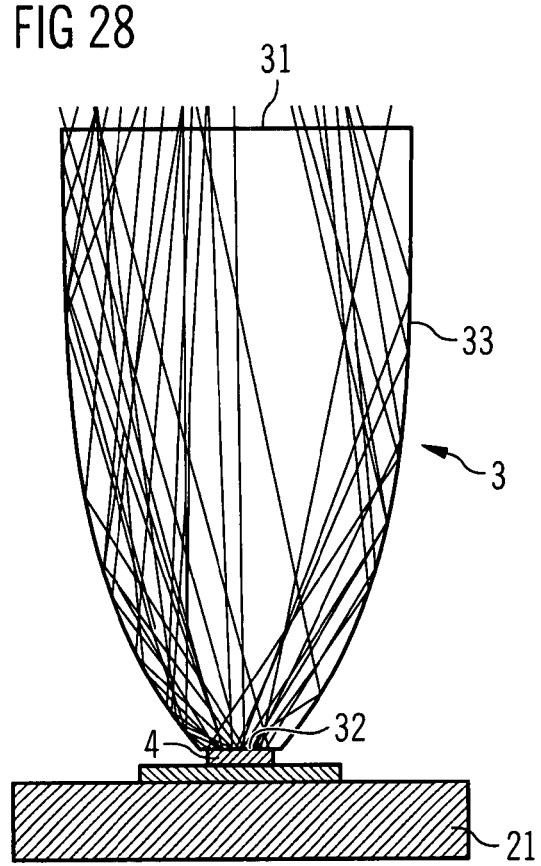
Figure 29:
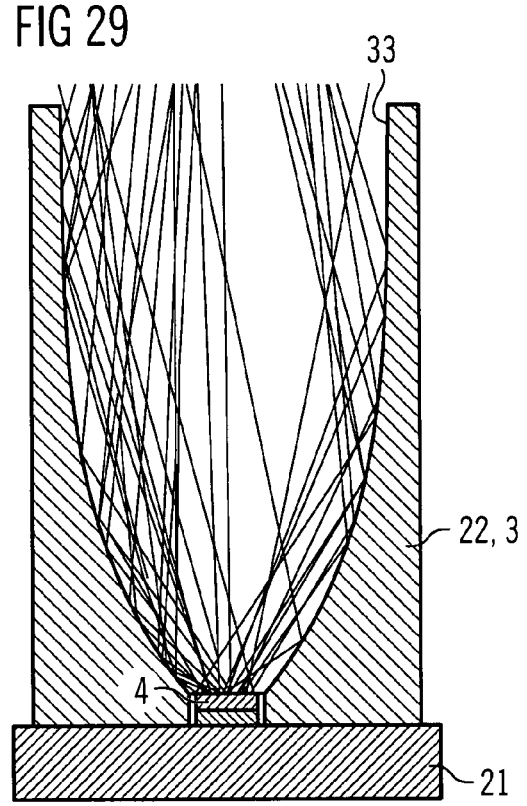
Figure 30:
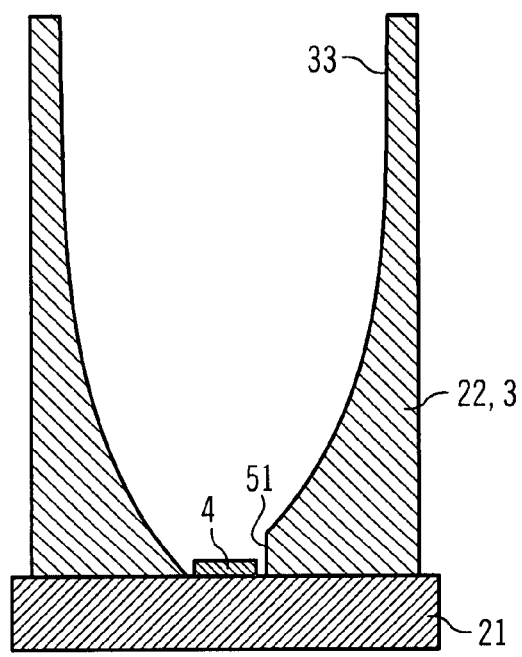

FIG. 1 shows a diagrammatic top view of a first exemplary embodiment of the component, FIG. 2 shows a diagrammatic three-dimensional representation of a second exemplary embodiment of the component, FIG. 3 shows a diagrammatic three-dimensional representation of a third exemplary embodiment of the component, FIG. 4 shows a diagrammatic three-dimensional representation of an illumination module comprising a component according to a fourth exemplary embodiment, FIG. 5 shows a diagrammatic three-dimensional representation of a fifth exemplary embodiment of the component, FIG. 6 shows a diagrammatic top view of a sixth exemplary embodiment of the component, FIG. 7 shows a diagrammatic three-dimensional representation of a seventh exemplary embodiment of the component, FIG. 8 shows the illumination module shown in FIG. 4 comprising a component according to an eighth exemplary embodiment, FIG. 9 shows a diagrammatic top view of a ninth exemplary embodiment of the component, FIG. 10 shows a diagrammatic three-dimensional representation of a tenth exemplary embodiment of the component, FIG. 11 shows a diagrammatic sectional view of a housing of an eleventh exemplary embodiment of the component in a plane perpendicular to a main direction of extent of the arrangement of the semiconductor chips, FIG. 12 shows a diagrammatic sectional view of a housing of a twelfth exemplary embodiment of the component in a plane perpendicular to a main direction of extent of the arrangement of the semiconductor chips, FIGS. 13 to 18 show a diagrammatic sectional view of the semiconductor chips of a component in a plane along the arrangement of the semi-conductor chips according to various exemplary embodiments, FIG. 19 shows a diagrammatic three-dimensional representation of a further exemplary embodiment of an illumination module comprising the component shown in FIG. 5, FIG. 20 shows a diagrammatic three-dimensional representation of a further exemplary embodiment of an illumination module comprising a further exemplary embodiment of the component, FIG. 21 shows a further exemplary embodiment of an illumination module comprising a further exemplary embodiment of the component, FIG. 22 shows a diagrammatic three-dimensional representation of the headlamp module shown in FIG. 21, in which the component has an additional optical element, FIG. 23 shows a diagrammatic top view of a further exemplary embodiment of an illumination module comprising a component according to a further exemplary embodiment, FIG. 24 shows a diagrammatic top view of a further exemplary embodiment of an illumination module comprising a component according to a further exemplary embodiment, FIGS. 25 and 26 show a diagrammatic three-dimensional representation of the illumination module shown in FIGS. 23 and 24, the component in each case having an additional optical element, FIG. 27 shows a diagrammatic three-dimensional representation of an optical element according to a first exemplary embodiment, FIG. 28 shows a diagrammatic sectional view of a part of a component in a plane perpendicular to the main direction of extent of the arrangement of semiconductor chips comprising a further exemplary embodiment of an optical element, FIG. 29 shows a diagrammatic sectional view of a part of a further exemplary embodiment of the component in a plane perpendicular to the main direction of extent of the semiconductor chip arrangement, FIG. 30 shows a diagrammatic sectional view of a part of a further exemplary embodiment of the component in a plane perpendicular to the main direction of extent of the semiconductor chip arrangement.

In the exemplary embodiments and figures, identical components or components having the same function are in each case provided with the same reference symbols. The elements of the figures shown are not to be considered as being true to scale and instead they may be represented somewhat enlarged for better understanding.

The component shown in FIG. 1 has a housing body 2 which comprises a carrier 21 and a frame 22. The frame 22 has inner walls 5 which delimit a cavity 50. In the cavity 50, constructed in the manner of a trench, a plurality of semiconductor chips 4, for example five pieces, are arranged in a linear arrangement. In the components 1 shown in FIGS. 1 to 7, the semiconductor chips 4 are arranged along a straight line.

The inner walls 5 have a relatively small distance from the semiconductor chips 4, this distance, for example, being less than or equal to a lateral edge length of the semiconductor chips 4. Correspondingly, the bottom 54 of the cavity 50 has a relatively small area and has an extent, for example along the arrangement of the semiconductor chips 4, of less than or equal to eight-times the lateral edge length of the semiconductor chips 4 and, perpendicular to a main direction of extent of the arrangement of the semiconductor chips, an extent of less than or equal to twice the lateral edge length of the semiconductor chips 4.

The semiconductor chips 4 are electrically mounted in the housing body 2 and are connected, for example, in series with one another. For this purpose, the bottom 54 of the cavity 50 has a plurality of inner electrical contact areas 12, the semiconductor chips being connected electrically conductively to the corresponding inner contact areas 12, e.g. by means of soldering or conductive adhesive, e.g. on their side facing the bottom 54 of the cavity 50, the semiconductor chips resting on a part of the respective contact area 12. A side of the semiconductor chips 4 facing away from the inner contact areas 12 is electrically conductively connected to the corresponding contact area, e.g. by means of a bonding wire 46 (see FIG. 1).

Two of the inner contact areas 12 extend on the carrier 21 up to an area of the carrier 21 which is laterally offset with respect to the frame 22 where they are electrically conductively connected to the outer contacts 14 of the component 1 via which the component 1 can be electrically connected externally.

In operation, the semiconductor chips 4 emit, e.g. an electromagnetic radiation from a blue or ultraviolet range of wavelengths. In the component shown in FIG. 1, the inner walls 5 of the frame 22 are constructed as reflectors for this electromagnetic radiation, i.e. the frame 22 has either a reflective material or is coated with a reflective material. In addition, the inner walls 5 extend obliquely to a mounting plane of the semiconductor chips 4 so that the electromagnetic radiation is reflected in a desired direction of radiation.

For example, the frame has or consists of aluminum oxide. As an alternative, it is also possible that the frame has a material which is less highly reflective such as, for example, aluminum nitride or a liquid crystal polymer (LCP) or consists of this and is additionally provided with a highly reflective layer, e.g. of aluminum. Using LCP as a material for the frame 22 has the advantage that the material can be adapted thermally to the carrier 21. The carrier 21 has as material, e.g. aluminum nitride which is inexpensive and has high thermal conductivity. Silicon or silicon carbide, for example, are also possible as alternative materials.

Constructing the housing body with a carrier 21 and a frame 22 and with contact areas 12, 14 applied to the carrier 21 provides for simple production of the component 1 in which, e.g. expensive creation of through-contacts is not required. As an alternative, however, the housing body can also be constructed of one piece, for example by molding a lead frame which comprises the respective contacts for the semiconductor chips 4 and the component 1.

In contrast to the component explained above by means of FIG. 1, the components shown in FIGS. 2 and 3 have inner walls 5 which do not extend obliquely but essentially perpendicularly to the assembly area of the semiconductor chips 4. In these components 1, too, the inner walls 5 are constructed e.g. to be reflective so that they act at least partially as a screening wall 51. The components 1 shown in FIGS. 4 to 10 also have at least one screening wall 51 which, in contrast to the remaining sections of the inner walls 5 extends relatively steeply with respect to a mounting plane of the semiconductor chips 4. A main plane of extent of the screening wall forms an angle of between 80° and 110° with the mounting plane. For example, the screening wall 51 is straight and is essentially inclined by an angle of 90° with respect to the mounting plane.

FIG. 11 shows an example of such a screening wall 51 in a diagrammatic sectional view. The semiconductor chip 4 is arranged at a distance 53 of, for example 100 μm with respect to the screening wall 51. With such a small distance 53, an effective screening effect of the screening wall 51 can be achieved even if the screening wall 51 is constructed to be relatively low, i.e. if it has a small height. Due to this small distance, a part of the electromagnetic radiation emitted by the semiconductor chips 4 additionally impinges on the screening wall 51 with a high radiation intensity per unit area, as a result of which it is made possible both to prevent radiation in a solid angle and to radiate the electromagnetic radiation in a desired, preferably narrow solid angle and with a high radiation density.

These characteristics are particularly desirable in headlamps, for example in car headlamps by means of which a particular solid angle is to be illuminated as brightly as possible. In the case of car headlamps, for example, it is intended to illuminate, for example, the roadway, i.e. particularly the road, as brightly as possible, on the one hand, but, on the other hand, however, approaching vehicles must not be blinded so that radiation of light into the upper solid angle is unwanted and to be avoided as much as possible. Precisely this can be achieved by a component having a screening wall 51. In addition, the stretched arrangement of semiconductor chips 4 provides for bright and flat homogeneous illumination of the path or the road over the entire width of the road.

If the radiation of electromagnetic radiation into a particular solid angle area of one half of the space is to be avoided, a construction of the inner walls 5 as exhibited by the components 1 shown in FIGS. 4 to 7 is particularly advantageous. In these, a section of the inner walls 5 is constructed as screening wall 51 on one side along the arrangement of the semiconductor chips 4 whereas the remaining sections of the inner walls 5 extend distinctly more obliquely with respect to the mounting plane of the semiconductor chips 4, for example at an angle of about 50°.

FIG. 4 shows an illumination module 150 which has a single component 1. As an alternative to the embodiment shown in FIG. 4, the component 1 of the illumination module 150 can be constructed in accordance with at least one of the components shown in FIG. 5, 6 or 7. The component 1 has such small dimensions that it can be advantageously used in many ways and can be assembled in a simple manner. For example, the component has a length which is less than fifteen-times the lateral edge length of the semiconductor chips 4, and a width which is less than eight-times the lateral edge length of the semiconductor chips 4, these exemplary dimensions applying to a component 1 having five semiconductor chips 4. In general, the length of the component naturally depends on the number of semiconductor chips 4 for which, e.g., the general formula $$L_{max} = k(1.5 \cdot n + 6)$$

can be set up, $L_{max}$, being the maximum length of the component 1, n the number of semiconductor chips 4 and k the lateral edge length of the semiconductor chips 4.

The illumination module 150 has a module carrier 18 in which two holes 17 and one recess 15 are inserted. The holes 17 are used for mechanical assembly and alternatively or additionally also for thermally connecting the illumination module 150. For example, the illumination module 150 can be placed with the holes 17 over one or two assembly pins with or without thread and attached with clamps or screws.

The module carrier 18 comprises a first layer 181 with good thermal conductivity and an electrically insulating second layer 182 which is applied on the first layer (see FIG. 8). The component 1 is applied in a recess of the second layer 182 on the first layer 181 of the module carrier 18 and mechanically and thermally conductively connected to the latter, e.g. by means of a solder or an adhesive.

The illumination module 150 also has two electrical contact areas 16, a part of which is located inside and a further part is located outside a module frame 19. Whereas the inner part of the electrical contact areas 16 is used for electrically connecting the component 1, the outer parts of the contact areas 16 form contacts for externally electrically connecting the illumination module 150. In particular, the component 1 can be used for a headlamp module, particularly also for automotive applications.

In contrast to the components explained above by means of FIGS. 1 to 7, the components 1 represented in FIGS. 8 to 10 are arranged not along only one but along two straight lines, these straight lines having an angle of about 15° with respect to one another. The lateral inner walls 5 have two part-sections which in each case extend in parallel to the adjoining arrangement of semiconductor chips and thus also have an angle of about 15° with respect to one another and which are also constructed as screening wall 51. A further section of the inner walls 5 extends in the form of a circular segment around the semiconductor chips 4 and is aligned distinctly more obliquely with respect to a mounting plane of the semiconductor chips 4 than the screening wall or screening walls 51, respectively.

In contrast to the component 1 shown in FIG. 8, the components 1 shown in FIGS. 9 and 10 have inner walls, the course of which around the semiconductor chips 4 is adapted better to the shape of the arrangement of semiconductor chips 4. That is to say the inner wall 5 does not have a section which extends around the semiconductor chips 4 in the form of a circular segment but the corresponding section of inner walls 5 is conducted around the semiconductor chips 4 in the form of an arc which runs close to the semiconductor chips so that the distance between the inner wall and the chips is small for every part of this section of the inner walls. This is advantageous for achieving the narrowest possible radiation angle in conjunction with the highest possible radiation density.

For example, the component 1 emits white light for which purpose it has, for example, a luminescence conversion element 7 which converts the radiation of a first band of wavelengths, emitted by the semiconductor chips 4, at least partially into a radiation of a second band of wavelengths different from the first band of wavelengths. White light can be generated either by mixing the radiation emitted by the semiconductor chip with the converted radiation or by the converted radiation having color components which, mixed together, result in white light.

The luminescence conversion element 7 can contain at least one luminous material. For this purpose, for example, inorganic luminescent materials are suitable such as garnets doped with rare earth (particularly Ce) or organic luminous materials such as perylene luminous materials. Other suitable luminous materials are listed, for example, in U.S Pat. No. 6,066,861, the content of which is herewith incorporated by reference to this extent.

In the components illustrated in FIGS. 11, 12, 14 and 15, the luminescence conversion element 7 is applied directly in the form of a thin layer to a radiation output area of the semiconductor chips 4. By producing the radiation conversion as close to the chip as possible, a resultant color impression which is as homogeneous as possible can be achieved which is independent of a radiation angle of the electromagnetic radiation. For this purpose, in particular, surface emitters such as, for example, thin film light-emitting diode chips are suitable as semiconductor chips 4.

A thin film light-emitting diode chip is characterized, in particular, by the following characteristic features:

on a first main area, facing a carrier element, of a radiation-generating sequence of epitaxial layers, a reflective layer is applied or formed which reflects at least a part of the electromagnetic radiation generated in the sequence of the epitaxial layers back into this sequence;

the sequence of epitaxial layers has a thickness in the range of 20 µm or less, particularly in the range of 10 µm; and the sequence of epitaxial layers contains at least one semiconductor layer having at least one area which has an intermixed structure which, in the ideal case, leads to an approximately ergodic distribution of the light in the epitaxial sequence of epitaxial layers, i.e. it has a stochastical scattering characteristic which is as ergodic as possible.

A basic principle of a thin film light-emitting diode chip is described, for example, in I. Schnitzer et al., Appl. Phys. Lett. 63 (16), Oct. 18, 1993, 2174-2176, the content of disclosure of which is herewith incorporated by reference to this extent.

A thin film light-emitting diode chip is in good approximation a Lambertian surface emitter and is therefore well suited for application in the component, particularly for a headlamp.

In the exemplary embodiment shown in FIG. 11, one side of the semiconductor chip 4 is electrically connected by means of a bonding wire 46 whereas in the exemplary embodiment shown in FIG. 12, the semiconductor chip, which is known as a flip-chip is constructed, for example in such a manner that it has both electrical contact areas 49 on the same side. This can facilitate the application of a thin layer of luminescence conversion material 7.

The semiconductor chips 4 can be cast either with a casting compound 9 (see FIG. 11) which is based, for example, on silicon, or covered with a cover plate 90 transparent to radiation (see FIG. 12), by which they are protected against external influences. As an alternative or additionally to a direct application of a thin film of luminescence conversion material 7 onto the semiconductor chips 4, the luminescence conversion material can also be mixed into the casting compound 9 with which the semiconductor chips 4 are cast, as shown in FIG. 13. To also achieve a resultant color impression which is as homogeneous as possible with such a casting compound 9, the casting compound has a maximum height 91 of, for example, 50 µm above the chips.

FIG. 13 shows a distance 42 of the chips from one another. This is, for example, 70 µm. In addition, FIG. 13 shows the lateral edge length 41 of the semiconductor chips 4. For headlamp applications, the highest possible radiation power and radiation density is frequently required so that, for example, high-power light-emitting diodes having a lateral edge length 41 of about 1 mm which has an electrical power of greater than at least 1 W, preferably of greater than 2 W, are used as semiconductor chips. A chip generates, for example, a radiation power of about 200 lumen. The component 1 can be operated, for example, with an electrical power of greater than or equal to 8 W, preferably of greater than or equal to 10 W, particularly preferably of greater than or equal to 12 W.

Due to the fact that the semiconductor chips 4 are arranged in a row linearly, effective heat removal of waste heat generated by the semiconductor chips when they are operated is possible in spite of the narrow distance between the semiconductor chips 4 since each semiconductor chip maximally adjoins a further semiconductor chip 4 at two opposite sides. Thus, lateral heat removal is possible at least at the two other opposite sides in each semiconductor chip without the heat of a number of semiconductor chips 4 building up significantly.

Figure 15:
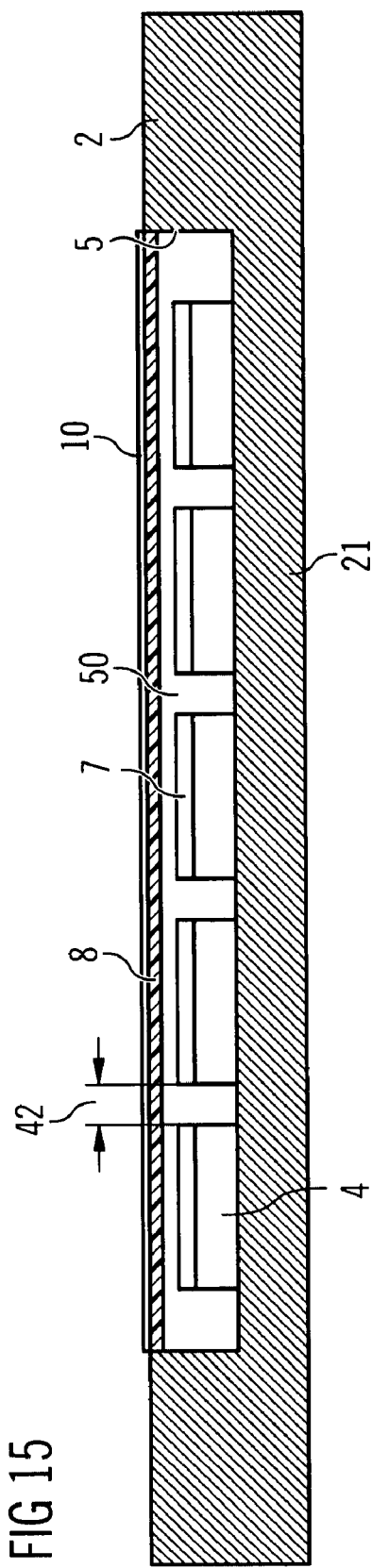

In the section of a component shown in FIG. 15, the semiconductor chips are covered with a carrier body 10 on which a diffuser layer 8 is applied which has a diffuser material. Due to the diffuser layer 8, improved homogeneity of the electromagnetic radiation emitted by the component 1 and improved intermixing of the radiation emitted by the semiconductor chips 4 and converted by the luminescence conversion material 7 can be achieved. The carrier body 10 is, for example, a thin disk made of a glass. It can be applied for example directly to the chips either by means of an adhesive or cover the cavity 5 at a certain distance from the semiconductor chips 4. To provide improved radiation output, a free surface of the carrier body 10 or of the diffuser layer 8 is, for example, roughened.

Figure 16:
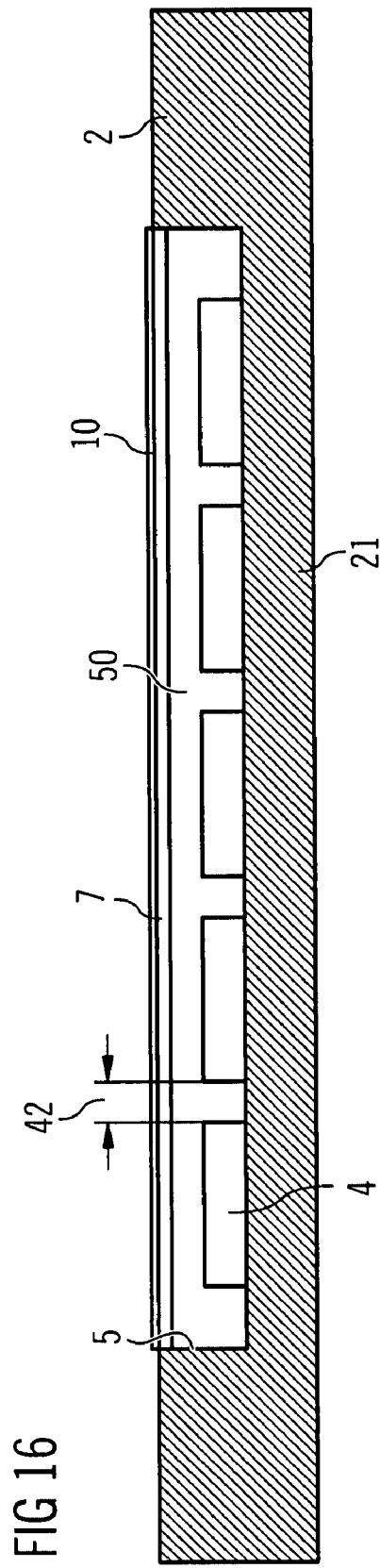

As an alternative or additionally, a thin layer of luminescence conversion material 7 can also be applied to the carrier body 10 (see FIG. 16 or FIGS. 17 and 18, respectively). An advantage of this can be that the surface of the carrier body 10 to which the luminescence conversion material 7 is applied can be formed more even than surfaces of semiconductor chips, the production of which can result in unevennesses of the surface which are not to be disregarded, due to production tolerances. As a result, it may be possible to apply the luminescence conversion material 7 more evenly and more controlled to a carrier body 10 as a result of which components having improved homogeneity of the emitted radiation can be generated.

If a diffuser layer 8 is applied to one side and a layer of luminescence conversion material 7 is applied to another side on the carrier body 10, this carrier body can be applied to or over the semiconductor chips in such a manner that either the layer of luminescence conversion material 7 or the diffuser layer 9 faces the semiconductor chips 4. The former has the advantage that radiation conversion takes place closer to the chip as a result of which a more homogeneous radiation pattern can be achieved. The latter, in contrast, has the advantage that the semiconductor chips 4 and the luminescence conversion material 7 are spatially separated from one another and better insulated from one another thermally.

Since both luminous materials and semiconductor chips usually suffer power losses at excessively high temperatures and also in each case generate heat themselves during operation, for example during radiation conversion, an at least partial thermal insulation of the semiconductor chips 4 and of the luminescence conversion material 7 from one another is advantageous.

The carrier body 10 with the applied layers can be applied to or over the semiconductor chip, for example by means of an adhesive or by means of a casting compound. It is also possible that a space free of solid or liquid material exists between the semiconductor chips 4 and the carrier body 10.

The illumination modules shown in FIGS. 19 to 22 and 23 have counterplugs 160 in which electrical contact areas 16 are integrated so that the illumination module can be electrically contacted externally by means of a plug. Counterplugs 160 are well known to a person with ordinary skill in the art, so details thereof are not deemed necessary.

The illumination modules 150 have, for example, an overvoltage protection for the semiconductor chips 4. Such a one is provided, for example, in the form of at least one varistor 161 which is connected in parallel with the component 1 or the semiconductor chips 4, respectively (see FIGS. 20 and 21).

FIG. 22 essentially shows the illumination module shown in FIG. 21, with the difference that the component 1 additionally has an optical element 3. This is constructed, for example, as a dielectric solid body, the outer faces of which comprise a radiation entry 32, a radiation exit 31 and side walls 33 connecting the radiation entry 32 to the radiation exit 31.

The optical element 3 is, for example, a non-imaging optical concentrator, the radiation entry 32 of the optical element 3 being the actual concentrator output so that the radiation leaves the optical element 3 through the radiation exit 31 with reduced divergence.

The side walls of the optical element are, for example, curved in the form of a parabola or like a parabola, that is to say the concentrator is, for example, a CPC-type concentrator.

Such an optical element is shown, for example, in a sectional view in FIG. 28, the section showing a part of the component 1 and extending perpendicular to a main direction of extent of the arrangement of semiconductor chips 4. Using this optical element 3, a divergence of the electromagnetic radiation, indicated by lines in FIG. 28, can be greatly reduced. So that the radiation density of the electromagnetic radiation is largely preserved, it is necessary to bring the optical element 3 or the radiation entry 32 of the optical element 3, respectively, as close as possible to a chip output area of the semiconductor chip 4. For example, the radiation entry 32 can be applied directly to the semiconductor chips 4.

As an alternative, it is also possible, for example, that a gap, which, for example, is largely free of solid or liquid material, exists between the semiconductor chips 4 and the radiation entry of the concentrator. The result is that, in particular, rays emitted at a particularly large angle with respect to a main direction of radiation of the semiconductor chips 4 and which would widen a radiation cone emitted from the radiation exit 31 too greatly, do not impinge on the radiation entry but go laterally past it. In the case of a dielectric concentrator, the gap leads to a situation where the greater the angle of incidence on the radiation entry 32, the greater a proportion of radiation is reflected at the boundary face of the radiation entry 32. In each case, a highly divergent proportion of the radiation impinging on the radiation entry 32 is thus weakened.

If, however, it is intended to prevent such reflection at the radiation entry 32, it can be roughened up (e.g., by sandblasting or etching), for example, as a result of which the proportion of the radiation passing into the concentrator or into the optical element 3, respectively, can be increased.

The basic body of the concentrator consists, for example, of a transparent glass, crystal or plastic and is made, for example, in a transfer molding process or injection molding process.

The closer the radiation entry 32 is brought to the semiconductor chips 4, the smaller the radiation entry 32 can be made and the higher the achievable radiation density of the radiation emitted from the radiation exit 31. The width of the radiation entry area 32 is, for example, 1.2-times as large as the lateral edge length of the semiconductor chips 4.

The radiation cone leaving the radiation exit 31 has an aperture angle of for example 9° in a plane perpendicular to a main line of extent of the arrangement of the semiconductor chips. To achieve this, the CPC-type concentrator needs a certain minimum length which is related to the width b of the radiation entry 32. For an ideal compact parabolic concentrator, the following applies:

$$l = b/2(1+\sin\theta)\cos\theta/\sin^2\theta,$$

where l is the minimum length and θ the maximum aperture angle of the radiation cone in a plane perpendicular to the main line of extent of the arrangement of the semiconductor chips 4. To achieve a maximum aperture angle of about 9°, the length of the optical element 3 must be about 23-times as large as the width of the radiation entry. For a maximum aperture angle of 15°, the length of the optical element 3 must be about 9-times as large as the width of the radiation entry 32, and for an aperture angle of 20°, this factor is about 5.5 and is still about 2.6 for an aperture angle of 30°.

As an alternative to a CPC-type concentrator, the optical element 3 has, for example, side walls which extend in straight lines from the radiation entry 32 to the radiation exit 31. An example of such an optical element 3 is shown in FIG. 27. This is a dielectric concentrator having a truncated-cone-like basic shape. In addition, the radiation exit 31 is domed outward in the manner of a spherical or aspherical lens. The advantage of an aspherical dome compared with a spherical dome is that the aspherical dome decreases, for example with increasing distance from the optical axis of the optical element 3, in order to take into account the circumstance that the radiation cone, the divergence of which is to be reduced by the optical element 3, is not a point-shaped light radiation source but a radiation source having a certain extent.

Compared with a CPC-type optical element, such an optical element has the advantage that it can be used for achieving a comparable reduction in the divergence of a radiation cone with simultaneous significant reduction in the constructional height of the optical element 3. A further advantage of the optical element 3 shown in FIG. 27 is that, due to its straight side faces 33, it can be produced more simply by means of an injection method such as, for example, injection molding or transfer molding.

As an alternative to a dielectric concentrator, the optical element 3 is, for example, a basic body having a cavity with reflecting inner walls, as shown, for example, in FIGS. 29 and 30. The optical element 3 can be formed, for example, by the inner walls 5 of the frame 22 or constructed of one piece with the frame 22. As an alternative, it is naturally also possible that the optical element is a separate element of the component which is arranged in the frame or above the frame 22. The inner walls of the frame, of the cavity of the optical element 3 and the side walls 33 of the dielectric concentrator can be provided with a reflective layer which has, for example, aluminum or consists of it.

The cavity of the optical element 3, shown in FIG. 30, is not constructed symmetrically as is the case in the optical elements 3 shown in FIGS. 28 and 29. Instead, the inner walls 33 of the optical element 3 or of the frame 22, respectively, have a section which is constructed as a screening wall 51 similar to the components shown in FIGS. 4 to 10. The height of this section of the inner walls 33 designed as screening wall 51 is, for example, between 400 μm inclusive and 1.5 mm inclusive, for example, the screening wall has a height of 800 μm. Following the section constructed as screening wall 51, the inner wall 33 extends symmetrically with respect to the opposite part of the inner wall 33.

Whereas the components 1 according to the exemplary embodiments shown in FIGS. 1 to 22 in each case only have 4 or 5 semiconductor chips 4, it is also possible, for example, that the component has more than 10, more than 20 or even more than 30 semiconductor chips 4.

The components 1 shown in FIGS. 23 and 24 have, for example, 30 semiconductor chips 4. These are not all connected in series but have several groups of, for example, 5 semiconductor chips 4 in each case, within which the semiconductor chips 4 are connected in series with one another. The individual groups of semiconductor chips 4 are connected in parallel with one another. Correspondingly, these components do not have only 2, but 12 external contact areas 14 of which 6 are in each case arranged on mutually opposite sides of the component 1.

Naturally, it is generally possible to interconnect the semiconductor chips arbitrarily with one another in the component 1. With reference to the components and illumination modules previously described by means of FIGS. 23 and 24, an arbitrary number of semiconductor chips and an arbitrary number of groups is possible for the groups of semiconductor chips. In the boundary case of only one semiconductor chip per group, all semiconductor chips are connected in parallel with one another.

In the exemplary embodiment shown in FIG. 23, the module 150 has two counterplugs 160 with electrical contact areas 16. In contrast, the illumination module shown in FIG. 24 has for each group of series-connected semiconductor chips 4 two electrical contact areas 16 so that these groups of semiconductor chips 4 can be taken into operation independently of one another in the module and can be operated with different current intensities. Naturally, such illumination modules can also have an optical element 3, as is shown, for example, in FIGS. 25 and 26. As previously already mentioned, such illumination modules are particularly suitable for use as headlamp modules in automobiles.

The use of the components 1 and of the illumination modules 150, respectively, is naturally restricted in no way to motor vehicle headlamps but comprises all conceivable types of headlamps. In addition, the invention is particularly also suitable for a projection light source. Furthermore, for example, the semiconductor chips 4 can be taken into operation independently of one another at least partially so that they are used for sequential projection of various projection images and/or different colors.

The description of the invention by means of the exemplary embodiments does not restrict the scope of protection of the invention to these. Thus, for example, it is not absolutely necessarily to arrange the semiconductor chips in a single row. Instead, it is also possible, particularly with a large number of semiconductor chips, to arranged these, for example, in two rows as long as the semiconductor chips are arranged linearly overall. The two rows of semiconductor chips together form the shape of the line. The invention comprises every new feature and every combination of features which, in particular, includes each combination of features in the patent claims even if this feature or this combination itself has not been explicitly specified in the patent claims or the exemplary embodiments.

The invention claimed is:

1. An optoelectronic component emitting electromagnetic radiation, the optoelectronic component comprising:
   a housing body which has a trench like cavity therein;
   a plurality of semiconductor chips arranged on a substantially planar surface of a common carrier and linearly within said trench like cavity; and
   at least one optical element provided to reduce a divergence of an electromagnetic radiation and jointly allocated to the plurality of semiconductor chips;
   wherein two neighboring semiconductor chips have a distance from one another which is less than or equal to 1.5 times a top surface edge length of the plurality of semiconductor chips and greater than or equal to 0 μm,
   wherein the optical element is a non-imaging optical concentrator having a concentrator exit,
   wherein the concentrator exit of the non-imaging optical concentrator is arranged to be a radiation entry of the optical element so that the electromagnetic radiation passes through the non-imaging optical concentrator in a reverse concentration direction and is thus not concentrated but leaves the non-imaging optical concentrator with reduced divergence through a radiation exit of the optical element,
   wherein an arrangement of the plurality of semiconductor chips has a first and a second end,
   wherein the first end has at least two semiconductor chips which are arranged along a first straight line which is inclined with respect to a second straight line along which has at least second two semiconductor chips arranged at the second end,
   wherein the first straight line is inclined with respect to the second straight line by an angle of inclination of less than or equal to 20° and greater than or equal to 10°, and
   wherein the radiation entry has at least one of a radiation entry area and a radiation entry opening which has a width of less than or equal to 1.5-times an edge length of the plurality of semiconductor chips.

2. The optoelectronic component as claimed in claim 1, wherein the two neighboring semiconductor chips have a distance from one another of less than or equal to 300 μm and greater than or equal to 0 μm.

3. The optoelectronic component as claimed in claim 2, wherein the two neighboring semiconductor chips have a distance from one another of less than or equal to 100 μm and greater than or equal to 0 μm.

4. The optoelectronic component as claimed in claim 1, wherein the plurality of semiconductor chips are arranged at least one of on a printed circuit board and on a lead frame.

5. The optoelectronic component as claimed in claim 1, wherein the housing body has on one side along the arrangement of the plurality of semiconductor chips an inner wall delimiting the trench like cavity, at least a section of the inner wall being constructed as a screening wall which is reflective for at least one spectral band of the electromagnetic radiation.

6. The optoelectronic component as claimed in claim 5, wherein the screening wall extends at an angle of greater than or equal to 80° and less than or equal to 110° with respect to a mounting plane of the plurality of semiconductor chips.

7. The optoelectronic component as claimed in claim 5, wherein the plurality of semiconductor chips are arranged at a distance of less than or equal to 1 mm and greater than or equal to 0 mm from the screening wall.

8. The optoelectronic component as claimed in claim 5, wherein the plurality of semiconductor chips are arranged at a distance of less than or equal to 500 μm and greater than or equal to 0 μm from the screening wall.

9. The optoelectronic component as claimed in claim 8, wherein the plurality of semiconductor chips are arranged at a distance of less than or equal to 150 μm and greater than or equal to 0 μm from the screening wall.

10. The optoelectronic component as claimed in claim 1, wherein the electromagnetic radiation leaves the optical element in a radiation cone which has an aperture angle between 0 and 30°, including the limits, in a plane perpendicular to a line along which the plurality of semiconductor chips are arranged.

11. The optoelectronic component as claimed in claim 1, wherein the non-imaging optical concentrator is one of a compound parabolic concentrator (CPC), a compound elliptic concentrator (CEC), and a compound hyperbolic concentrator (CHC).

12. The optoelectronic component as claimed claim 1, wherein the non-imaging optical concentrator has side walls which connect the radiation entry to the radiation exit and which are constructed in such a manner that direct connecting lines between the radiation entry and the radiation exit, extending on the side walls, are essentially straight.

13. The optoelectronic component as claimed in claim 1, wherein the non-imaging optical concentrator has a basic body which defines a cavity having an inner wall reflective at least for a spectral part-band of the electromagnetic radiation.

14. The optoelectronic component as claimed in claim 1, wherein the non-imaging optical concentrator is a dielectric concentrator, a basic body of which is a solid body consisting of a dielectric material having a suitable index of refraction so that radiation coupled in via the radiation entry is reflected by total reflection on lateral boundary faces of the solid body to a surrounding medium which connect the radiation entry to the radiation exit.

15. The optoelectronic component as claimed in claim 14, wherein the radiation exit is a boundary face of the solid body domed in the manner of a lens.

16. The optoelectronic component as claimed in claim 1, wherein a gap exists between the plurality of semiconductor chips and the radiation entry of the non-imaging optical concentrator.

17. The optoelectronic component as claimed in claim 16, wherein the gap is largely free of solid or liquid material.

18. The optoelectronic component as claimed in claim 1, wherein the component has a luminescence conversion element.

19. The optoelectronic component as claimed in claim 18, wherein the luminescence conversion element is intermixed in a casting compound transparent to radiation, by means of which the plurality of semiconductor chips are encapsulated.

20. The optoelectronic component as claimed in claim 19, wherein the casting compound has a thickness of less than or equal to 200 μm and greater than or equal to 5 μm over the plurality of semiconductor chips.

21. The optoelectronic component as claimed in claim 18, wherein the luminescence conversion element is applied to the plurality of semiconductor chips.

22. The optoelectronic component as claimed in claim 18, wherein a carrier body transparent to the electromagnetic radiation, on which the luminescence conversion element is applied, is arranged on the plurality of semiconductor chips.

23. The optoelectronic component as claimed in claim 22, wherein the luminescence conversion element is arranged on a side of the carrier body facing away from the plurality of semiconductor chips.

24. The optoelectronic component as claimed in claim 1, wherein the component has a diffuser material.

25. An illumination module, comprising an optoelectronic component as claimed in claim 1.

26. The illumination module as claimed in claim 25, wherein the illumination module is a headlamp module.

27. The illumination module as claimed in claim 25, wherein an overvoltage protection is provided for the optoelectronic component.

28. The illumination module as claimed in claim 27, wherein the overvoltage protection comprises at least one varistor.

* * * * *